(12) United States Patent
Lee et al.

(10) Patent No.: US 7,332,734 B2
(45) Date of Patent: Feb. 19, 2008

(54) LITHOGRAPHY APPARATUS AND PATTERN FORMING METHOD USING THE SAME HAVING AN LIQUID CRYSTAL PANEL FOR A PHOTO MASK FUNCTION

(75) Inventors: Ki Dong Lee, Sungnam-si (KR); Seh Won Ahn, Seoul (KR); Sung Hoon Pieh, Seoul (KR); Byoung Ho Park, Kyungiu-si (KR); Gyu Tae Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 416 days.

(21) Appl. No.: 11/139,618

(22) Filed: May 31, 2005

(65) Prior Publication Data

US 2005/0264788 A1   Dec. 1, 2005

(30) Foreign Application Priority Data

Jun. 1, 2004  (KR)  ............. 10-2004-0039693

(51) Int. Cl.
*G01N 21/86* (2006.01)

(52) U.S. Cl. ............... 250/559.3; 250/208.1

(58) Field of Classification Search ......... 250/208.1, 250/548, 559.4, 559.29, 559.3; 356/399–402; 355/52, 53; 345/626, 636, 519
See application file for complete search history.

(56) References Cited

U.S. PATENT DOCUMENTS

| 6,040,909 A * | 3/2000 | Hasegawa et al. ......... 356/614 |
| 6,121,626 A | 9/2000 | Lin |
| 6,967,708 B1 | 11/2005 | Yokoyama et al. |

FOREIGN PATENT DOCUMENTS

| EP | 0 552 953 A1 | 7/1993 |
| JP | 07-192982 | 7/1995 |
| JP | 11-197862 | 7/1999 |
| JP | 2004-004433 | 1/2004 |
| WO | WO-02/39189 A1 | 5/2002 |

* cited by examiner

*Primary Examiner*—Que T Le
(74) *Attorney, Agent, or Firm*—Birch, Stewart, Kolasch & Birch, LLP (57) ABSTRACT

A lithography apparatus is provided. The apparatus includes: a stage, a first light source unit, an optical system, an image obtaining means, an image edit means, an LC panel, and a second light source unit. The LC panel is coupled with the optical system and receives a signal of the image edited by the image edit means and displays the received image to perform a photo mask function. The second light source unit provides light used in performing an exposure on the test material using the imaged displayed on the LC panel for a photo mask.

30 Claims, 11 Drawing Sheets

LITHOGRAPHY APPARATUS AND PATTERN FORMING METHOD USING THE SAME HAVING AN LIQUID CRYSTAL PANEL FOR A PHOTO MASK FUNCTION

BACKGROUND OF THE INVENTION

1. Field of the Invention

The present invention relates to a lithography apparatus and a pattern forming method using the same.

2. Description of the Related Art

A semiconductor technology remarkably developed for the recent ten years. The performance of the semiconductor has increased twice every eighteen month according to a so-called 'Moore's law' and what was like a dream yesterday has been realized today. A photolithography technology occupies a position at the backside of this rapid development. The photolithography is a crucial process technology in the semiconductor, for positioning a mask of a predetermined pattern on a wafer spread with a photo resist sensitive to light and illuminating light to form a mask shape. The photolithography is a crucial process occupying about 70% of the semiconductor realization process and remains one of the most important processes even in recent processes where a line width reduces.

The photolithography technology is applied as a technology for obtaining a predetermined pattern in the fields of a micro electronic, a micro electromechanical system (MEMS), and a biotechnology application.

The photolithography technology will be briefly described below. An energy-sensitive material called a resist is coated on a semiconductor wafer (e.g., a silicon wafer). A photo mask used in a semiconductor process has a mark carved in a film called a mask or a reticle, for position alignment of an image to be patterned with another image on another reticle. When light from a laser beam (generally, UV of a mercury arc lamp) light source passes through the patterned mask and is illuminated, an image of the mask pattern is created within the resist. After that, an exposed portion or a non-exposed portion of the resist is removed using a means such as a solution-based developer or a plasma etching, so that a patterned resist is created. Photolithography description is limited up to this point. After that, the developed pattern is used as a mask for etching in a subsequent process. The resist is removed afterwards. In the case of a plurality of devices, subsequent layers are formed and the process is repeated, so that upper patterns are formed within the devices. For manufacturing an integrated circuit (IC) device, the photolithography process is repeated using masks of 20 to 25 or more.

A problem the lithography technology faces during the device process is as follows. Since a high-speed operation and a low-power driving become possible as a line width is reduced, the semiconductor process is being oriented to the direction realizing a narrower line width. However, the most crucial problem in an exposure system that uses light as a list source is that diffraction of light gets serious as the line width gets narrow, which causes an error in the process and generates performance deterioration of the device.

The most fundamental method resolving this problem is to use a light source having a wavelength smaller than a pattern size. Alternatively, there is a projection lithography system that adopts a light source having a small wavelength and uses a reduction lens disposed between a mask and a substrate. It is possible to obtain a fine pattern and prevent diffraction of light from the light source even with the light source having a small wavelength using the reduction lens.

In the meantime, one of variables important as much as the light source in the lithography technology is a photo mask functioning as a film of a pattern, and an error with respect to a design measure should be minimized for accuracy of a result pattern. Therefore, an electron-beam (E-beam) lithography apparatus having no process error due to diffraction is used when the mask is manufactured. The process order is the same as the general lithography process order but a glass substrate or a quarz substrate having optical transmittance characteristics is used for the substrate and a polymethyl methacrylate (PMMA) (positive) for the E-beam is used for a photo sensitive agent. A surface where a PMMA pattern is carved is filled with Cr, and finally the photo sensitive agent is removed. The mask manufacture in this manner is called a hard mask. The hard mask is generally expensive and can be used in the exposure process more than two hundreds of times, and washing and inspection are required when repeatedly used. Besides, there are an emulsion mask or a film mask, which is cheap but has a disadvantage that it is difficult to use for a fine pattern.

Since such a photo mask requires a long time in manufacturing and has a fixed pattern shape, masks of different shapes are required for respective operations.

Accordingly, a manufacture cost of the mask increases. To overcome such a disadvantage, it should be possible to change the shape of the mask freely.

A liquid crystal (LC) panel is drawing attention as a candidate for a new mask meeting such a requirement. Since it is possible to freely change the image of the mask pattern using various image programs used in a computer and transmit the changed image to the LC panel in real-time, the LC panel has an advantage in viewpoint of cost and time in manufacturing the mask.

In the LC panel, a pixel is a basic unit and the LC contained in each of the pixel on/off-operates in response to an electric field to express a black and white. Electrode lines for applying an electric field are disposed in rows and columns of the pixel forming the LC panel. The portions of the electrode lines always remain transparent without an influence of the electric field. Therefore, one of the most crucial problems in using the LC panel for the mask is that a developed pattern is broken by pixel unit as is the shape of the portion of the electrode lines.

Accordingly, a variety of studies for overcoming the above problem are under progress.

SUMMARY OF THE INVENTION

Accordingly, the present invention is directed to a lithography apparatus and a pattern forming method using the same that substantially obviate one or more problems due to limitations and disadvantages of the related art.

An object of the present invention is to provide a lithography apparatus and a pattern forming method using the same capable of selectively forming a predetermined pattern in an arbitrary shape on a predetermined region while observing a substrate.

Another object of the present invention is to provide a pattern correcting method capable of correcting and recovering a damaged pattern in the case where the damaged pattern is observed when observing a substrate having a pattern.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a lithography apparatus including: a stage on which a test material is put; a first light source unit for providing light used in observing the test material on the stage; an optical system having an eyepiece for observing the test material on the stage; an image obtaining means for obtaining an image of the test material observed through the optical system; an image edit means for receiving the image obtained by the image obtaining means to edit the received image; a liquid crystal (LC) panel coupled to the optical system, for receiving a signal of the image edited by the image edit means and displaying the received image to perform a photo mask function; and a second light source unit for providing light used in performing an exposure on the test material using the image displayed on the LC panel for a photo mask.

In another aspect of the present invention, there is provided a pattern forming method using a lithography apparatus in the lithography apparatus having an optical system having an eyepiece, a first light source unit for providing light used in observing a test material through the optical system, an LC panel coupled to the optical system, for performing a photo mask function using an image displayed, and a second light source unit for providing light used for an exposure to the LC panel, the method including: observing the test material on which a photo resist film is coated through the optical system and selecting a region where a pattern is to be formed on the test material; outputting and displaying a predetermined image on the LC panel and illuminating light provided from the second light source unit using the displayed image for a photo mask to perform an exposure on the photo resist film of the test material; developing the exposed photo resist film to form a patterned photo resist film on the test material; depositing a metal film on the patterned photo resist film; and removing the patterned photo resist film and the metal film deposited thereon using a lift-off method to form a patterned metal film on the test material.

In a further another aspect of the present invention, there is provided a pattern correcting method using a lithography apparatus in the lithography apparatus having an optical system having an eyepiece, a first light source unit for providing light used in observing a test material through the optical system, an LC panel coupled to the optical system, for performing a photo mask function using an image displayed, a second light source unit for providing light used for an exposure to the LC panel, an image obtaining means for obtaining an image of the test material observed through the optical system; an image edit means for editing the image obtained by the image obtaining means, the method including: observing a test material where a photo resist film is coated on a patterned metal film through the optical system and selecting a region where the pattern of the metal film is damaged; obtaining an image of the metal film having the damaged pattern using the image obtaining means; editing an image pattern for correction that corresponds to the damaged pattern for the image obtained by the image obtaining means using the image edit means; displaying the image pattern for correction on the LC panel, and illuminating light provided from the second light source unit using the displayed image for a photo mask to perform an exposure on the photo resist film on the damaged pattern region of the test material; developing the exposed photo resist film to form a patterned photo resist film on the test material; depositing a metal film on the patterned photo resist film; and removing the patterned photo resist film and the metal film deposited thereon using a lift-off method, and forming the patterned metal film on the test material to correct the damaged pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
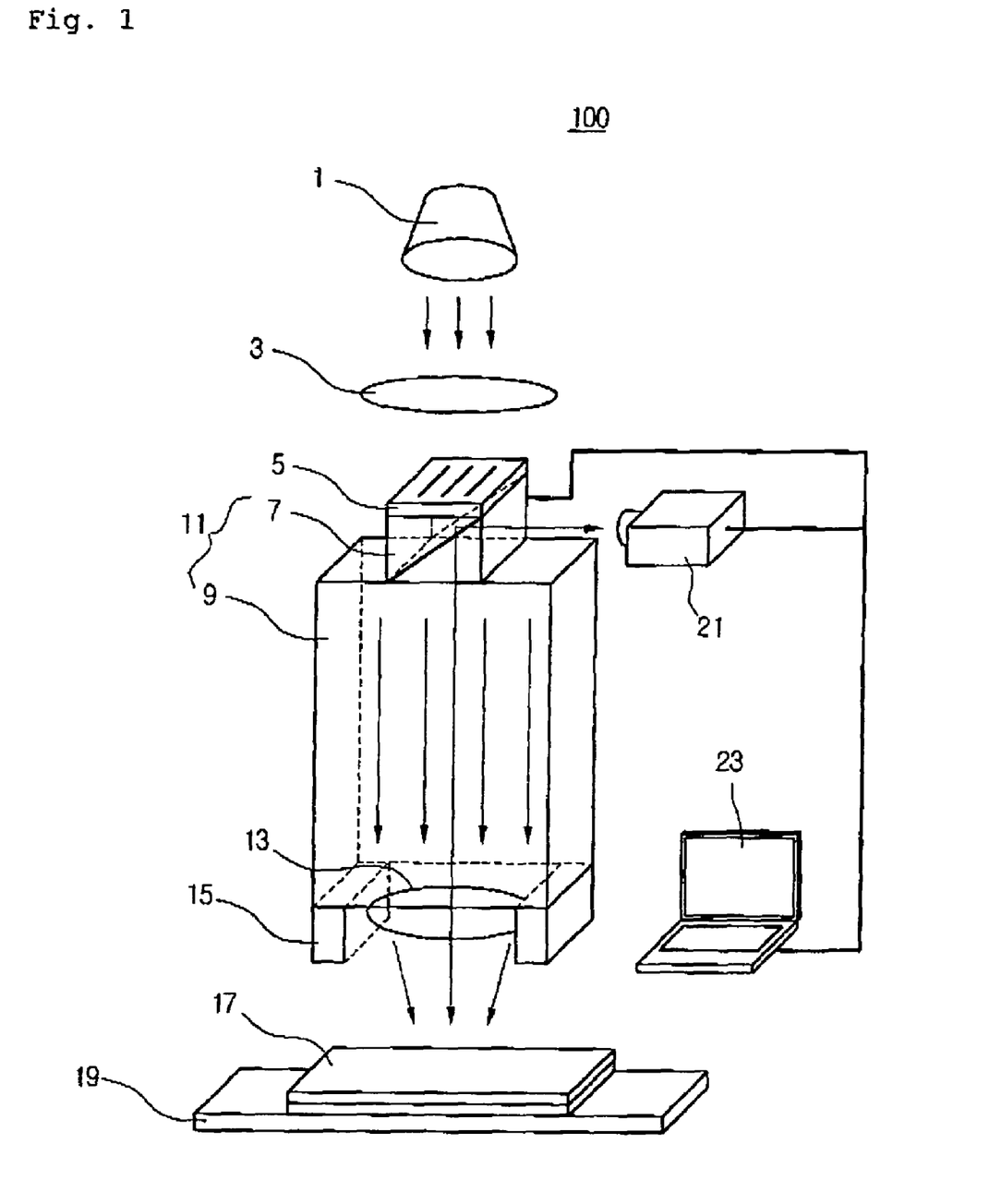
FIG. 1 is a schematic view of a lithography apparatus according to the present invention.

FIG. 1 is a schematic view of a lithography apparatus according to the present invention.

Referring to FIG. 1, a lithography apparatus 100 of the present invention includes: a stage 19 on which a test material 17 is put; a first light source unit 15 for providing light used in observing the test material 17 on the stage 19; and an optical system 11 having an eyepiece 7 for observing the test material 17 on the state 19 and an optical microscope 9. Here, the first light source unit 15 can include a yellow lamp for providing light in a yellow wavelength band and be disposed between the optical system 11 and the stage 19.

Also, the lithography apparatus 100 further includes: an image obtaining means 21 for obtaining an image of the test material 17 observed through the optical system 11; and an image edit means 23 for receiving an image obtained by the image obtaining means 21 and editing the received image. Here, the image obtaining means 21 can be a camera of a charge coupled device (CCD) and the image edit means 23 can be a personal computer (PC).

Also, the lithography apparatus 100 further includes: an LC panel 5 coupled to the optical system 11, for receiving a signal of the imaged edited by the image edit means 23 and displaying the received image to perform a photo mask function; and a second light source unit 1 for providing light used in performing an exposure on the test material 17 using the imaged displayed on the LC panel 5 for a photo mask. At this point, a transmissive LC panel is used for the LC panel 5. Data can be transmitted between the image obtaining means 21 and the image edit means 23, and the image edit means 23 and the LC panel 5 through a universal serial bus (USB) cable.

Here, a reduction lens 13 for reducing and illuminating light incident through the LC panel 5 on the test material 17 can be further disposed between the optical system 11 and the stage 19. Also, a condense lens 3 can be further disposed between the LC panel 5 and the second light source unit 1.

Also, the second light source unit 1 may be an ultraviolet (UV) lamp for providing light in an ultraviolet wavelength band and may be a mercury lamp. Also, the second light source unit 1 may include both the UV lamp and the mercury lamp so that one of them can be selectively used if necessary.

In the meantime, the optical system 11 may include a plurality of eyepieces and may have a plurality of connection ports for connecting to an external apparatus. FIG. 1 exemplarily illustrates that the image obtaining means 21 is connected with one eyepiece 7 and the LC panel 5 is connected with one connection port. However, the image obtaining means may be connected with the eyepiece 7 and connected with the connection port, which is a selective problem depending on a user's necessity.

Referring to FIG. 1 and FIGS. 2A to 2D, processes for forming a pattern using the lithography apparatus of the present invention will be described. FIGS. 2A to 2D are views illustrating processes for forming a pattern using a lithography apparatus according to the present invention.

Figure 2A:
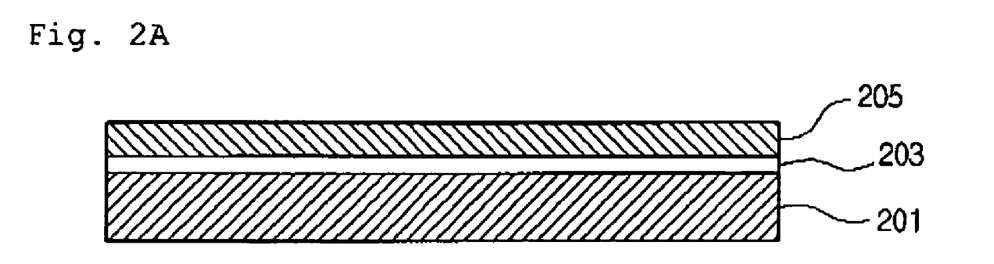
FIGS. 2A to 2D are views illustrating processes for forming a pattern using a lithography apparatus according to the present invention.

First, referring to FIG. 2A, a photo resist film 205 is formed on a substrate 201.

At this point, before the photo resist film 205 is formed, hexamethyldisilazane (HMDS) 203 may be formed on the substrate 201 first. Here, the HMDS has a property of generating ammonia gas when touched with water or alcohol and is a chemical material containing silicon. The HMDS is used to enhance adhesiveness of the photo resist film 205.

Next, while the substrate 201 on which the photo resist film 205 is coated is observed using the optical system 11 of the lithography apparatus 100 illustrated in FIG. 1, a region where a pattern is to be formed is selected on the substrate 201.

Here, an image displayed on the LC panel 5 is used as a photo mask for exposure intended for forming a pattern on the substrate 201. At this point, the image displayed on the LC panel 5 can be an image edited by the image edit means 23 such as a computer. Also, the image displayed on the LC panel 5 may be a pattern of an image obtained by the image obtaining means 21 such as a CCD camera.

As described above, referring to FIG. 2B, a predetermined image is outputted and displayed on the LC panel 5 and the light provided from the second light source unit 1, which is a light source for exposure, is illuminated using the displayed image for a photo mask, so that the exposure on the photo resist film 205 of the substrate 201 is performed. Here, the photo resist film 205 can be made of a transparent material or a photo resist material in AZ1500 series.

Figure 2B:
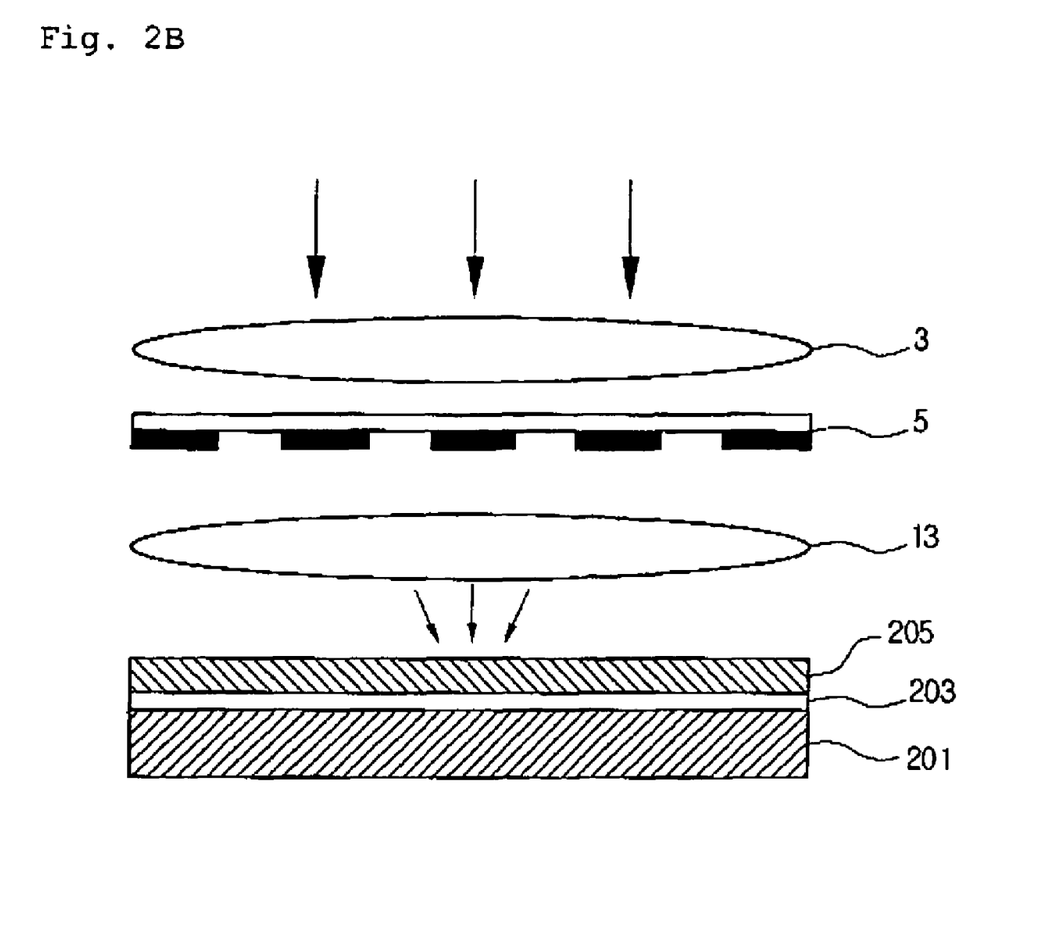

At this point, the condense lens 3 and the reduction lens 13 are further disposed on the optical path of the lithography apparatus 100, so that the exposure on the photo resist film 205 can be more effectively performed. Here, the second light source unit 1 may be a UV lamp or a mercury lamp.

Figure 2C:
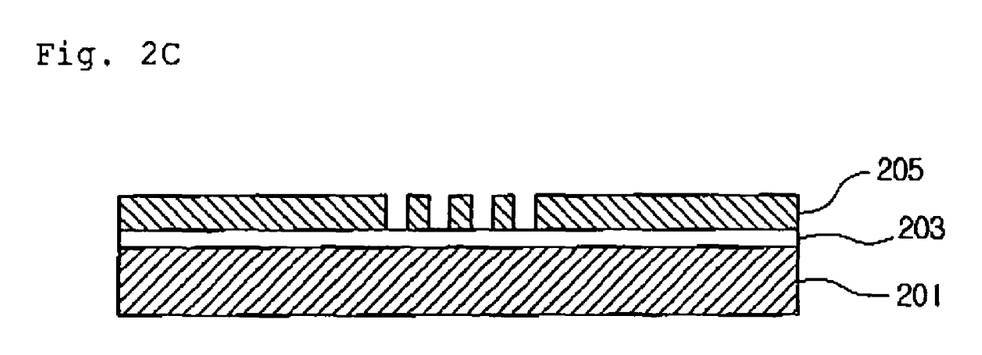
Figure 3:
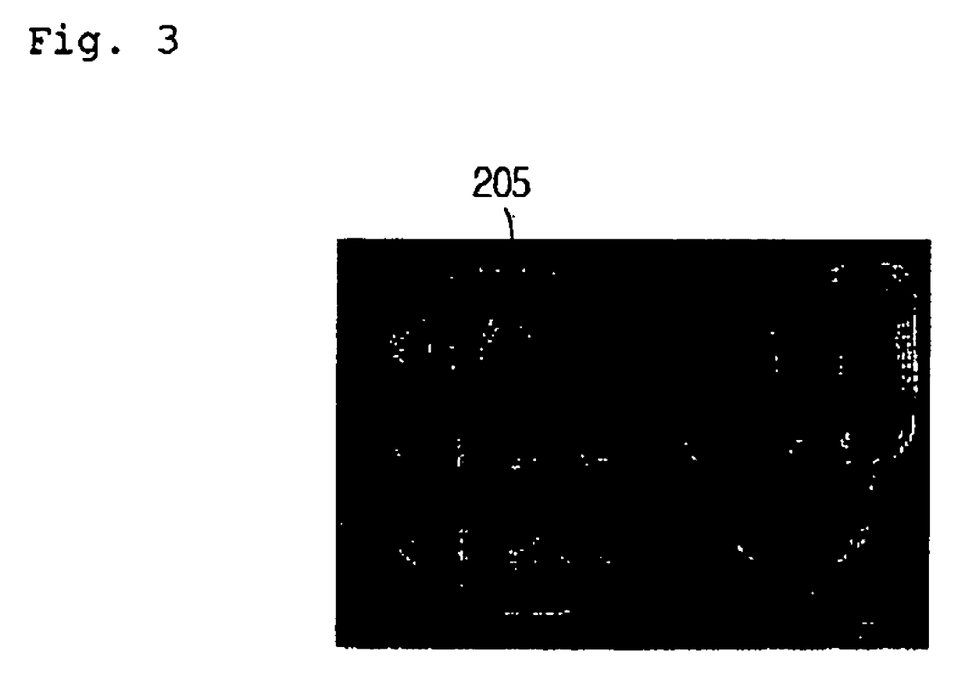
FIG. 3 is an exemplary view of the patterned photo resist film of FIG. 2C.

After that, the exposed photo resist film 205 is developed, so that a patterned photo resist film 205 can be formed on the substrate 201 as illustrated in FIG. 2C. FIG. 3 is an exemplary view of the patterned photo resist film formed by the above-described processes.

Figure 2D:
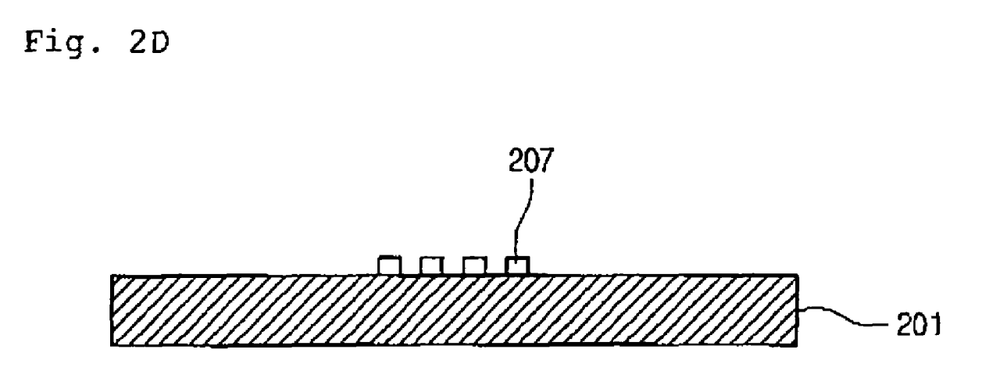
Figure 4:
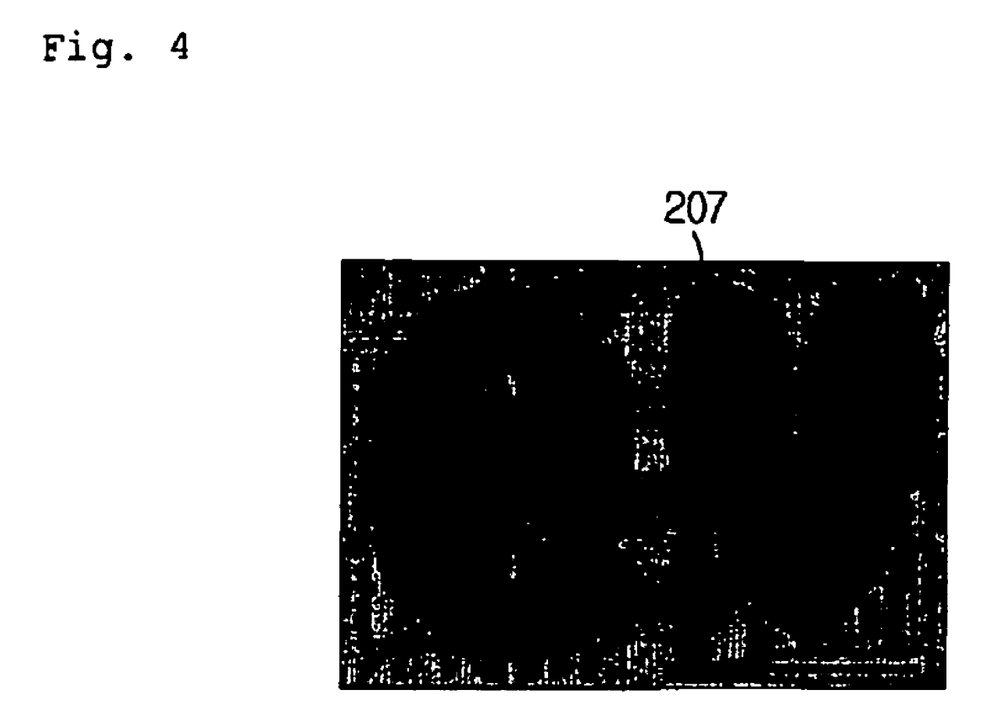
FIG. 4 is an exemplary view of the formed pattern resulted by a lift process of FIG. 2D.

Next, a metal film deposition process is performed on the patterned photo resist film 205. Subsequently, the patterned photo resist film 205 and the metal film deposited thereon are removed using a lift-off method, and the patterned metal film 207 is formed on the substrate 201 as illustrated in FIG. 2D. FIG. 4 is an exemplary view of the formed pattern resulted by the above lift process.

Through the above-described process, the predetermined region is selected while the test material is observed, and the required pattern can be selectively formed on the selected region.

In the meantime, the process for forming the pattern may not be performed for one region but performed for a plurality of regions. Also, although the patterns formed on respective regions may have the same shape one another, the patterns may be all different one another. Since the present invention uses the image displayed on the LC panel 5 for the photo mask, the pattern to be formed on each region can be arbitrarily formed and used.

In the case where there are a plurality of regions where the patterns are to be formed on the substrate 201 as described above, the exposure process is performed for each region and after all of the exposure process are performed, the development process is performed collectively, so that the pattern forming can be effectively performed.

That is, in the present invention, after the exposure is performed on the photo resist film 205 of the substrate 201 using the image displayed on the LC panel 5 for the photo mask, a process for selecting again a region where a pattern having a predetermined shape on the substrate 201 is performed using the optical system 11. Next, processes for editing an image pattern of the predetermined shape to be formed on the selected relevant region, displaying the edited image pattern on the LC panel 5, and performing the exposure on the selected region, are repeatedly performed. The respective exposure processes for forming the pattern on the substrate 201 are all performed through the repeated process and the photo resist film 205 of the substrate 201 are developed collectively, so that the pattern forming can be effectively performed.

Figure 5:
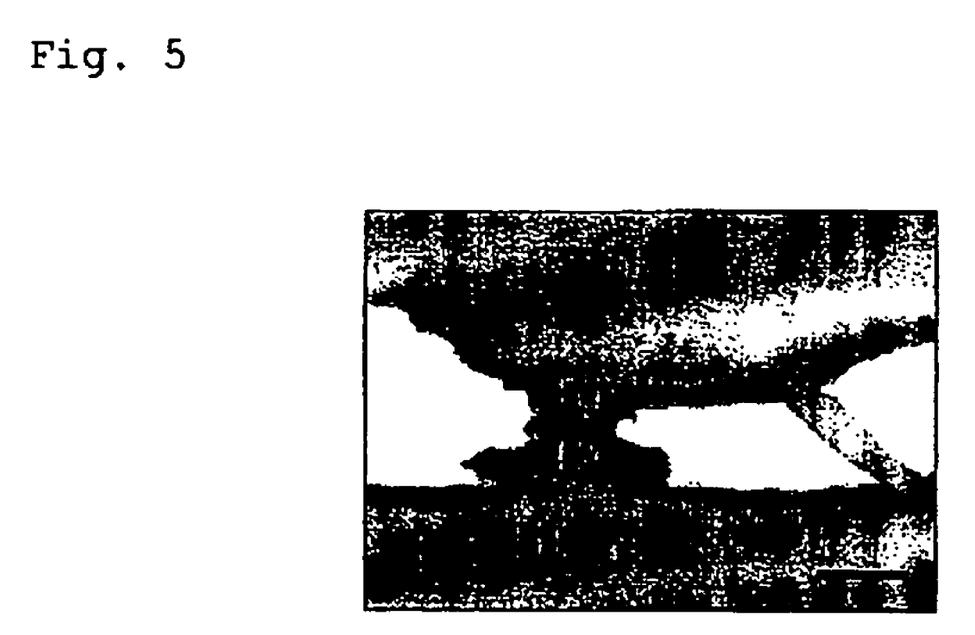
FIG. 5 is an exemplary view of a damaged pattern in a test material having a pattern formed by a general deposition process.

In the meantime, in forming a predetermined pattern on the substrate using the above-described pattern forming process or other pattern forming processes, there might occurs a case in which the shape of the pattern actually formed on the substrate is a shape different from the predetermined shape. FIG. 5 is an exemplary view of a damaged pattern in a test material having a pattern formed by a general deposition process.

In the case where there isn't a proper method for correcting the damaged pattern, the relevant substrate cannot be used. However, the lithography apparatus of the present invention can provide a method for finding out the damaged pattern and correcting and recovering the damaged pattern. A method for correcting a pattern using the lithography apparatus of the present invention will be briefly described below.

First, while a test material where a photo resist film is coated on a patterned metal film is observed using the lithography apparatus, a region where the metal film pattern has been damaged is selected.

Next, an image of the metal film where the pattern has been damaged is obtained through an image obtaining means (e.g., a CCD camera) provided to the lithography apparatus. After that, an image pattern for correction that corresponds to the damaged pattern of the image obtained by the image obtaining means is edited by an image edit means (e.g., PC) provided to the lithography apparatus.

Subsequently, the image pattern for correction is displayed on the LC panel and light provided from the second light source unit (e.g., a UV lamp or mercury lamp), which is a light source for exposure, is illuminated using the displayed image for a photo mask, so that the exposure is performed on a photo resist film of the damaged pattern region of the substrate.

After that, the exposed photo resist film is developed to form a patterned photo resist film on the substrate, and a process for depositing a metal film is performed on the patterned photo resist film.

Next, the patterned photo resist film and the metal film deposited thereon are removed using a lift-off method, and a patterned metal film is formed on the substrate, so that a process for correcting the damaged pattern is performed.

Figure 6:
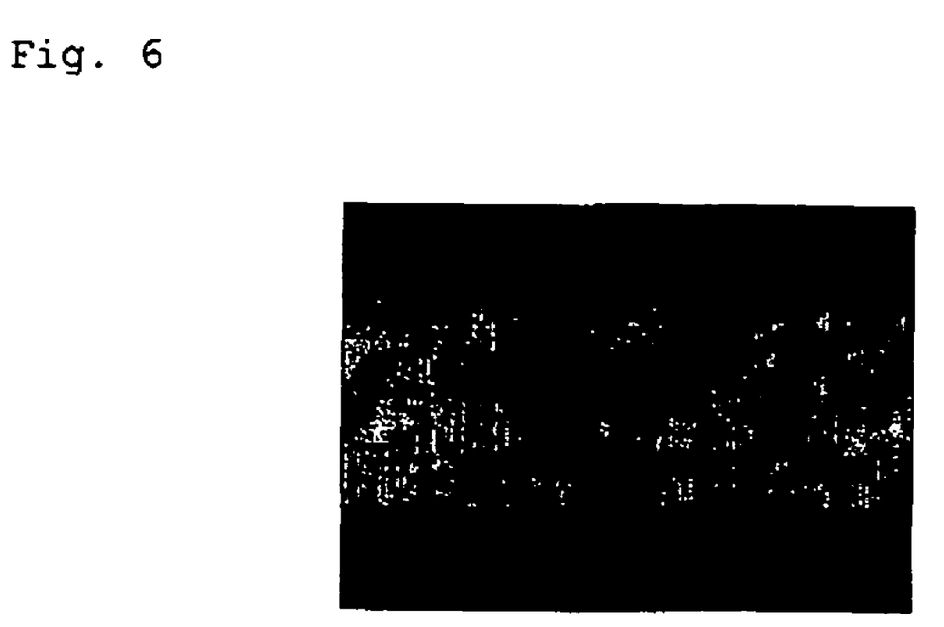
FIG. 6 is a view illustrating correction results for the damaged pattern of FIG. 5 using a lithography apparatus of the present invention.

Through such series of processes, the process for observing the damaged pattern and the process for correcting the damaged pattern can be performed in real-time. A corrected result for the damaged pattern is illustrated in FIG. 6. FIG. 6 is a view illustrating a corrected result for the damaged pattern of FIG. 5 using a lithography apparatus of the present invention.

In the case where there are a plurality of damaged patterns on the substrate, the exposure process is performed for each region and after all of the exposure processes are performed, the development processes are performed collectively, so that the pattern forming can be effectively performed.

That is, in the present invention, after the exposure is performed on the photo resist film of the damaged pattern region of the substrate using the edited image pattern for correction, another region where the metal film pattern has been damaged is found using the optical system of the lithography apparatus. Next, an image pattern for correction appropriate for the damage pattern is edited again and the edited image pattern for correction is displayed on the LC panel. Subsequently, a process for performing the exposure for correcting the damaged pattern is repeatedly performed, so that the exposure processes for correcting all of the damaged patterns of the substrate are all performed. After that, the development processes for the photo resist films of the substrate are performed collectively, so that the pattern forming can be effectively performed.

Figure 7:
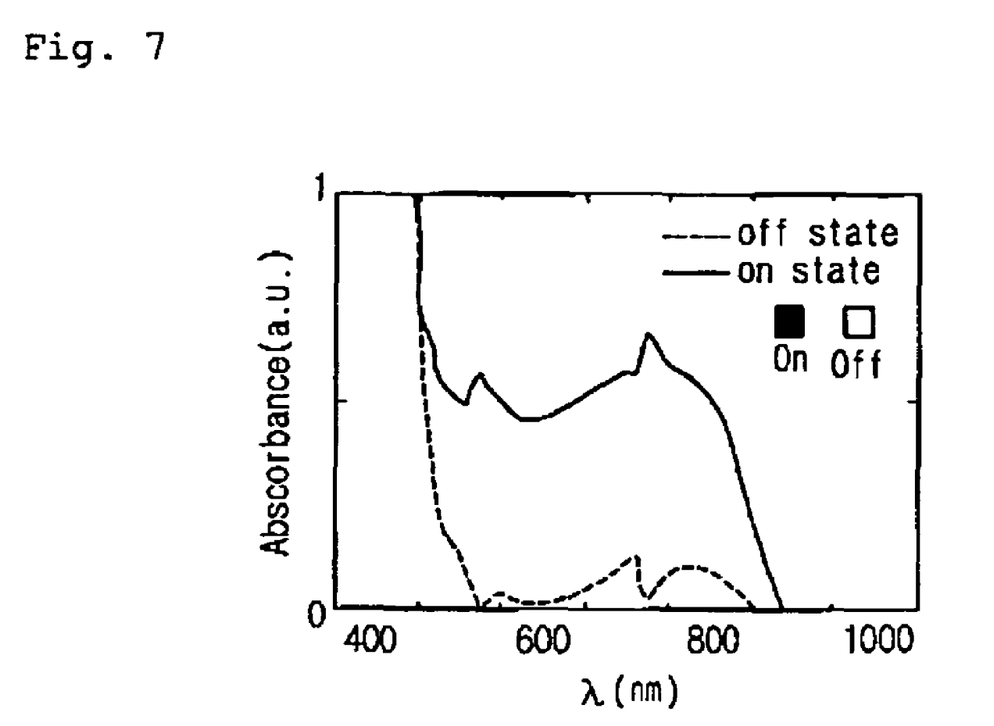
FIG. 7 is a view illustrating light absorption characteristics of a general LC panel.

In the meantime, a graph illustrated in FIG. 7 has been obtained as a result of a light absorption experiment performed to select a light source and a photo resist film appropriate for the LC panel. FIG. 7 is a view illustrating light absorption characteristics of a general LC panel. The experiments have been performed for the cases where pixels of the LC panel are in an on-state and in an off-state, respectively. The graph shows that the LC panel does not transmit light in a wavelength band below 400 nm.

Figure 8:
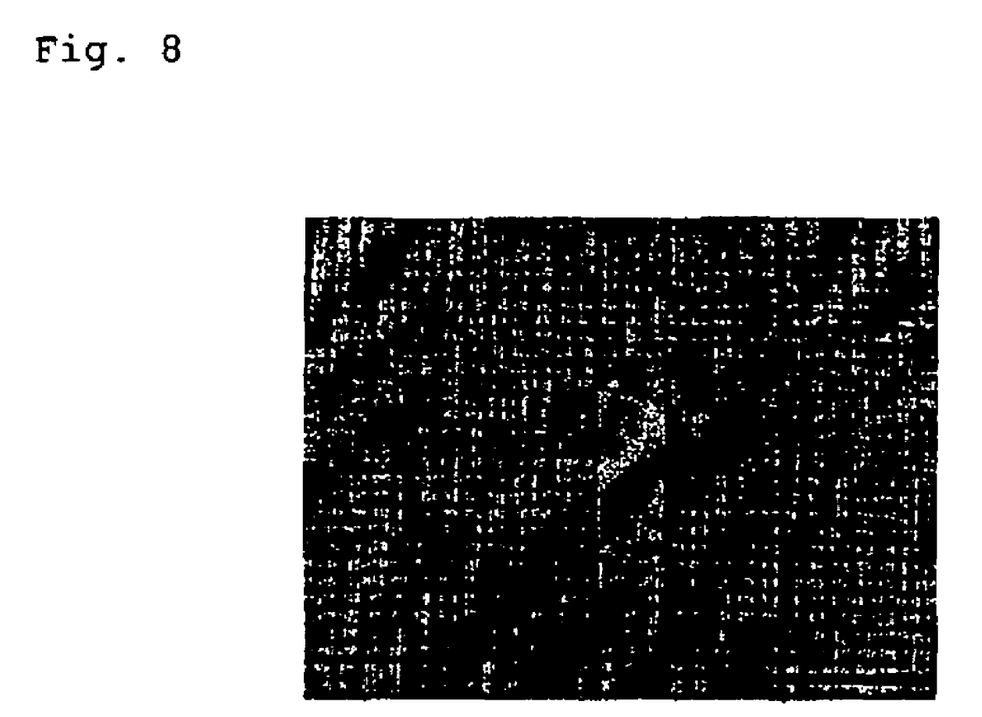
FIG. 8 is an exemplary view of a broken pattern between pixels in the case where an exposure condition is not proper in a lithography apparatus according to the present invention.

The present invention selects the light source for exposure and a material of the photo resist film on the base of the above optical characteristics of the LC panel and obtains an appropriate process condition thereof. That is, since a pattern due to the boundary between respective pixels is reflected in the lithography apparatus that uses the LC panel, a broken pattern between the pixels may be obtained as illustrated in FIG. 8. FIG. 8 is an exemplary view of a broken pattern between pixels in the case where an exposure condition is not proper in a lithography apparatus according to the present invention.

According to the present invention, it is possible to obtain a predetermined image pattern on the substrate without the broken pattern between the pixels using appropriate exposure condition and development time as described above. The present invention solves the problem that the broken pattern occurs by pixel unit of the LC panel by providing an appropriate exposure condition using the mercury lamp and the photo resist film in the AZ1500 series.

Further, for making a predetermined pattern on a portion observed in real-time, the selective exposure is required. The present invention mounts the CCD camera and connects the CCD camera to the computer to perform 1:1 image conversion in cooperation with the LC panel. Accordingly, the lithography apparatus can be used as an optical microscope capable of taking a photograph while performing observation in normal time and used as the lithography apparatus capable of performing the selective exposure using the LC panel for the photo mask if necessary. Considering that the optical microscope is a fundamental equipment easily found in companies or research centers in universities, the lithography apparatus of the present invention has a great influence in that it can easily perform a photolithography function by merely installing the LC panel and the CCD camera.

Also, it is also expected to be able to find out and correct defects of a fine pattern in real-time when high specifications of the LC panel and the lens of the optical system are prepared.

Also, it is expected that the present invention is applied to a biology field where a UV is selectively illuminated on a cell of a suitable creature under observation using the optical microscope by changing a kind of the light source used in the exposure.

As described above, the lithography apparatus and the pattern forming method using the same have an advantage of selectively forming a predetermined pattern in an arbitrary shape on a predetermined region while observing the substrate.

Also, the method for correcting the pattern using the lithography apparatus has an advantage of correcting and recovering the damaged pattern in the case where the damaged pattern is observed while observing the substrate where the patter is formed.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A lithography apparatus comprising:
   a stage on which a test material is put;
   a first light source unit for providing light used in observing the test material on the stage;
   an optical system having an eyepiece for observing the test material on the stage;
   an image obtaining means for obtaining an image of the test material observed through the optical system;
   an image edit means for receiving the image obtained by the image obtaining means to edit the received image;
   an LC(liquid crystal) panel coupled to the optical system, for receiving a signal of the image edited by the image edit means and displaying the received image to perform a photo mask function; and a second light source unit for providing light used in performing an exposure on the test material using the image displayed on the LC panel for a photo mask.

2. The apparatus according to claim 1, wherein the optical system further has a first connection port to which the image obtaining means is connected and a second connection port to which the LC panel is connected.

3. The apparatus according to claim 1, further comprising a reduction lens disposed between the optical system and the stage, for reducing and illuminating light incident through the LC panel on the test material.

4. The apparatus according to claim 1, wherein the first light source unit is a yellow lamp for providing light in a yellow wavelength band.

5. The apparatus according to claim 1, wherein the first light source unit is disposed between the optical system and the stage.

6. The apparatus according to claim 1, wherein the second light source unit is a UV lamp for providing light in an ultraviolet wavelength band.

7. The apparatus according to claim 1, wherein the second light source unit is a mercury lamp.

8. The apparatus according to claim 1, further comprising a condense lens disposed between the LC panel and the second light source unit.

9. A pattern forming method using a lithography apparatus in the lithography apparatus having an optical system having an eyepiece, a first light source unit for providing light used in observing a test material through the optical system, an LC panel coupled to the optical system, for performing a photo mask function using an image displayed, and a second light source unit for providing light used for an exposure to the LC panel, the method comprising:

observing the test material on which a photo resist film is coated through the optical system and selecting a region where a pattern is to be formed on the test material;

outputting and displaying a predetermined image on the LC panel and illuminating light provided from the second light source unit using the displayed image for a photo mask to perform an exposure on the photo resist film of the test material;

developing the exposed photo resist film to form a patterned photo resist film on the test material;

depositing a metal film on the patterned photo resist film; and removing the patterned photo resist film and the metal film deposited thereon using a lift-off method to form a patterned metal film on the test material.

10. The method according to claim 9, wherein the lithography apparatus further has a reduction lens disposed between the optical system and the test material, for reducing and illuminating light incident through the LC panel on the test material.

11. The method according to claim 9, wherein the first light source unit is a yellow lamp for providing light in a yellow wavelength band.

12. The method according to claim 9, wherein the first light source unit is disposed between the optical system and a stage for supporting the test material.

13. The method according to claim 9, wherein an image displayed on the LC panel is displayed by receiving, from an image edit means, a signal of an image edited by the image edit means and outputting the received signal.

14. The method according to claim 13, wherein the image edit means receives an image obtained by an image obtaining means.

15. The method according to claim 9, wherein the second light source unit is a UV lamp for providing light in a ultraviolet wavelength band.

16. The method according to claim 9, wherein the second light source unit is a mercury lamp.

17. The method according to claim 9, further comprising a condense lens disposed between the LC panel and the second light source unit.

18. The method according to claim 9, wherein the photo resist film is a transparent material.

19. The method according to claim 9, wherein the photo resist film is a material in AZ1500 series.

20. The method according to claim 9, wherein after the performing of the exposure on the photo resist film of the test material using the displayed image for the photo mask, and after selecting again a region where an image pattern of a predetermined shape to be formed on the test material using the optical system, editing the image pattern of the predetermined shape to be formed on the selected region to display the edited image pattern on the LC panel and repeatedly performing an exposure on the selection region so that the performing of the exposure to form the pattern on the test material is completed, developing the photo resist films of the test material is performed collectively.

21. A pattern correcting method using a lithography apparatus in the lithography apparatus having an optical system having an eyepiece, a first light source unit for providing light used in observing a test material through the optical system, an LC panel coupled to the optical system, for performing a photo mask function using an image displayed, a second light source unit for providing light used for an exposure to the LC panel, an image obtaining means for obtaining an image of the test material observed through the optical system; an image edit means for editing the image obtained by the image obtaining means, the method comprising:

observing the test material where a photo resist film is coated on a patterned metal film through the optical system and selecting a region where the pattern of the metal film is damaged;

obtaining an image of the metal film having the damaged pattern using the image obtaining means;

editing an image pattern for correction that corresponds to the damaged pattern for the image obtained by the image obtaining means using the image edit means;

displaying the image pattern for correction on the LC panel, and illuminating light provided from the second light source unit using the displayed image for a photo mask to perform an exposure on a photo resist film of the damaged pattern region of the test material;

developing the exposed photo resist film to form a patterned photo resist film on the test material;

depositing a metal film on the patterned photo resist film; and removing the patterned photo resist film and the metal film deposited thereon using a lift-off method and forming the patterned metal film on the test material to correct the damaged pattern.

22. The method according to claim 21, wherein the lithography apparatus further has a reduction lens disposed between the optical system and the test material, for reducing and illuminating light incident through the LC panel on the test material.

23. The method according to claim 21, wherein the first light source unit is a yellow lamp for providing light in a yellow wavelength band.

24. The method according to claim 21, wherein the first light source unit is disposed between the optical system and a stage for supporting the test material.

25. The method according to claim 21, wherein the second light source unit is a UV lamp for providing light in a ultraviolet wavelength band.

26. The method according to claim 21, wherein the second light source unit is a mercury lamp.

27. The method according to claim 21, further comprising a condense lens disposed between the LC panel and the second light source unit.

28. The method according to claim 21, wherein the photo resist film is a transparent material.

29. The method according to claim 21, wherein the photo resist film is a material in AZ1500 series.

30. The method according to claim 21, wherein after the exposure is performed on the photo resist film of the damaged pattern region of the test material using the image pattern for correction, and after finding out another region having a damaged pattern of the metal film and editing again an image pattern for correction suitable for the found damaged region, displaying the edited image pattern for correction on the LC panel to repeatedly perform the exposure for correcting the damaged pattern so that the performing of the exposure to correct all of the damaged pattern on the test material is completed, developing the photo resist films of the test material is performed collectively.

* * * * *